United States Patent
Goyal et al.

(10) Patent No.: US 9,455,691 B2
(45) Date of Patent: Sep. 27, 2016

(54) FLIP-FLOP CELL WITH CONFIGURABLE DELAY

(71) Applicants: Gaurav Goyal, Greater Noida (IN); Ashis Maitra, New Delhi (IN); Ateet Mishra, Delhi (IN)

(72) Inventors: Gaurav Goyal, Greater Noida (IN); Ashis Maitra, New Delhi (IN); Ateet Mishra, Delhi (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 138 days.

(21) Appl. No.: 14/516,680

(22) Filed: Oct. 17, 2014

(65) Prior Publication Data

US 2016/0112036 A1    Apr. 21, 2016

(51) Int. Cl.
*H03K 3/3562* (2006.01)
*H03K 19/173* (2006.01)

(52) U.S. Cl.
CPC ...... *H03K 3/35625* (2013.01); *H03K 19/1737* (2013.01)

(58) Field of Classification Search
CPC ............. G01R 31/31715; G01R 31/318536; G01R 31/31858; G06F 17/5068
See application file for complete search history.

(56) References Cited

U.S. PATENT DOCUMENTS

| | | | |
|---|---|---|---|
| 4,534,028 A * | 8/1985 | Trischler | G01R 31/31856 714/731 |
| 5,365,528 A * | 11/1994 | Agrawal | G01R 31/31832 714/724 |
| 6,065,145 A * | 5/2000 | Bencivenga | G01R 31/31858 714/724 |
| 6,614,276 B2 | 9/2003 | Robertson | |
| 6,895,540 B2 | 5/2005 | Chen | |
| 7,649,395 B2 | 1/2010 | Ahmadi | |
| 7,843,218 B1 | 11/2010 | Ramaraju | |
| 8,222,921 B2 | 7/2012 | Lewis | |
| 8,316,340 B2 | 11/2012 | Chen | |
| 8,493,119 B2 | 7/2013 | Leach | |
| 8,572,539 B2 * | 10/2013 | Cortadella | H03K 19/20 327/142 |
| 9,098,486 B1 * | 8/2015 | Tan | G01R 31/3177 |
| 2004/0190331 A1 * | 9/2004 | Ross | G11C 29/1201 365/154 |

OTHER PUBLICATIONS

Rubil Ahmadi, "A Hold Friendly Flip-Flop for Area Recovery", IEEE No. 04253501, 2007.
Rubil Ahmadi, "A Power Efficient Hold-Friendly Flip-Flop", 2007, IEEE No. 04606326, 2007.

* cited by examiner

*Primary Examiner* — Phung M Chung
(74) *Attorney, Agent, or Firm* — Charles E. Bergere

(57) ABSTRACT

Flip-flop cells that enable time borrowing during the design of the IC to improve setup times while avoiding introducing meta-stability, and alternatively to avoid hold time violations. The flip-flop cells are connected with logic cells in functional data paths. The flip-flop cell has a clock signal controlling both its input and output. A selective delay cell selectively delays either a data signal input to the flip-flop cell or the clock signal controlling the flip-flop cell. The selectively delayed signal adjusts the timing (setup, hold and clock-to-output) of the data path.

11 Claims, 5 Drawing Sheets

FLIP-FLOP CELL WITH CONFIGURABLE DELAY

BACKGROUND OF THE INVENTION

The present invention is directed to integrated circuits and, more particularly, to a flip-flop cell with a configurable delay.

In integrated circuits (IC), clocked flip-flops are commonly used for propagating data through various data paths. Such flip-flops typically include master and slave latches using clock signals for receiving data inputs and propagating data within the IC, in functional mode of operation. Testability typically requires groups of the flip-flops to be connected, in scan test mode, into a serial scan register chain for loading and unloading scan test signals (test vectors).

Proper operation during either functional or test modes requires that the input data be valid without changing again at minimum during the setup time of the flip-flop before being captured at the clock signal edge, and that the input data of the flip-flop remain stable at minimum for a hold time after the clock signal edge for the flip-flop to reliably latch the data.

The maximum clock frequency at which an IC can operate is defined by the time taken to propagate data along the slowest path including logic and flip-flops. In functional mode, this operating frequency is often among the critical performance criteria of the IC. Among other factors, the setup time of flip-flops in some data propagation paths limits the maximum clock frequency. Slow operating frequency is a less important criterion for scan test operation and thus slower transistors can be used in the test data input paths to reduce hold time violations without the effect on setup time being a concern. Setup time problems for functional mode however can be improved by using different, faster transistors in the logic data path, but there is a limit on the speed that can be achieved.

Conventionally, buffers have been added to clock distribution paths to reduce setup time problems. However, the addition of a buffer to resolve setup time problems may degrade hold time violations. Also, the addition of a buffer incurs a penalty in terms of power consumption, chip area, and routing resources. This design problem arises only at the design stage of an IC but the penalties are incurred throughout the life of the IC.

While some slow sections of the functional data path may limit the timing performance, other sections may exhibit timing slack, that is to say that they perform better than the timing requirements. It is possible to borrow from the timing slack in a later section of the functional data path to improve the setup timing of an earlier section of the path.

It would be advantageous to have a way during the design process of flexibly configuring the slower and faster sections of the data paths to stably improve overall timing performance and with little or no penalty in terms of power consumption, chip area, and routing resources.

BRIEF DESCRIPTION OF THE DRAWINGS

The present invention, together with objects and advantages thereof, may best be understood by reference to the following description of embodiments thereof shown in the accompanying drawings. Elements in the drawings are illustrated for simplicity and clarity and have not necessarily been drawn to scale.

DETAILED DESCRIPTION OF THE INVENTION

Figure 1:
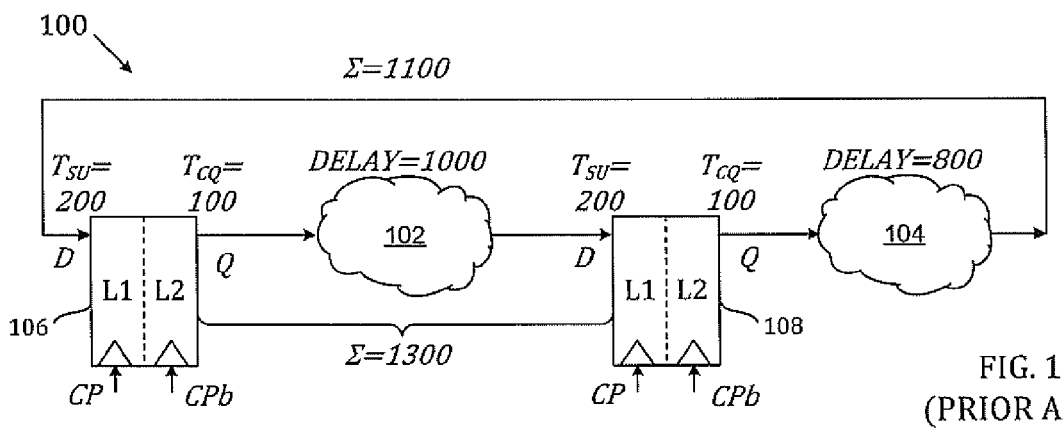
FIG. 1 is a schematic block diagram of a data path having a propagation time that limits operating clock frequency in a conventional integrated circuit.
Figure 2:
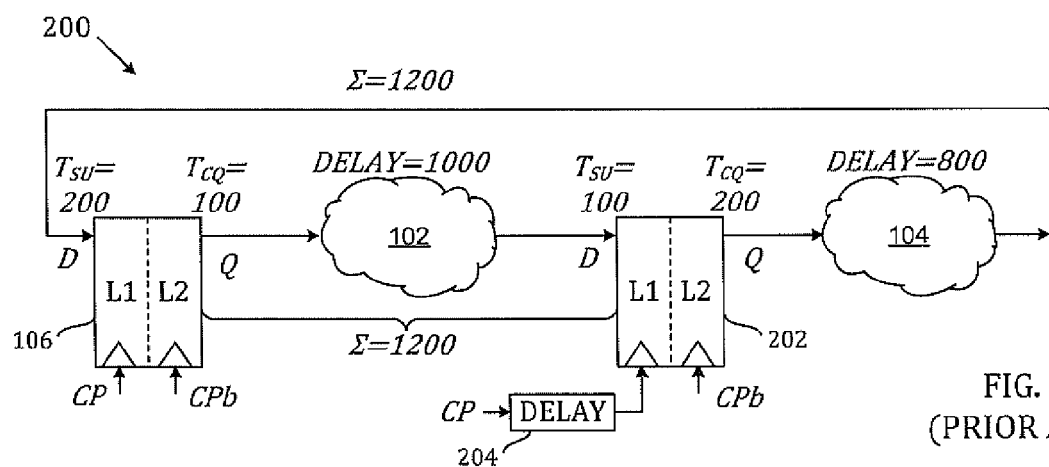
FIG. 2 is a schematic block diagram of a data path having a propagation time improved compared to FIG. 1 in a conventional integrated circuit.

FIGS. 1 and 2 illustrate conventional integrated circuits (ICs) including data paths 100 and 200. The data paths 100 and 200 include logic cells 102 and 104 and flip-flop cells 106 and 108 or 202. The flip-flop cells 106 and 108 or 202 are connected with the logic cells 102 and 104 in a combination in a functional mode, and are connected together in series in a scan test mode for shifting scan test data into the IC. In the functional mode, the data paths 100 and 200 have a forward loop including the output of the flip-flop cell 106, the logic cells 102 and the input of the flip-flop cell 108 or 202, and a return loop including the output of the flip-flop cell 108 or 202, the logic cells 104 and the input of the flip-flop cell 106.

In the data path 100, the flip-flop cells 106 and 108 each have master and slave latches L1 and L2 that are clocked by the same clock signal CP. In this illustration, the flip-flop cells 106 and 108 have the same setup time $T_{SU}$=200 ps and the same clock-to-output time $T_{CQ}$=100 ps. The logic cells 102 have a processing delay of 1000 ps and the logic cells 104 have a processing delay of 800 ps. The maximum operating clock frequency is defined by the slowest loop. The forward loop has a total propagation time of 1300 ps and the return loop has a total propagation time of 1100 ps. Accordingly, the maximum operating clock frequency is limited to 1/(1300 ps)=769 MHz, even though the return loop could run at a faster clock frequency.

As shown in FIG. 2, in the data path 200, the flip-flop cell 106 has master and slave latches L1 and L2 clocked by the same clock signal CP. However, in this example, the flip-flop cell 202 has setup timing slack. The master latch L1 is clocked by a delayed clock signal provided by passing the clock signal CP through a delay element 204 introducing 100 ps delay, while the slave latch L2 is still clocked by the clock signal CP. The timing of the flip-flop cell 202 is modified so that its setup time is reduced to $T_{SU}$=100 ps and its clock to output time is increased to $T_{CQ}$=200 ps. As a result of this time borrowing, the forward loop now has a total propagation time of 1200 ps, which is equal to that of the return loop. Accordingly the maximum operating clock frequency is increased to 1/(1200 ps)=833 MHz.

However, the data path 200 does not have an optimum setup time and has meta-stability issues. Overcoming the meta-stability would need a data delay to be introduced between the master and slave latches of the flip-flop cell 202, which would degrade the setup time, losing the advantage of time borrowing.

Figure 3:
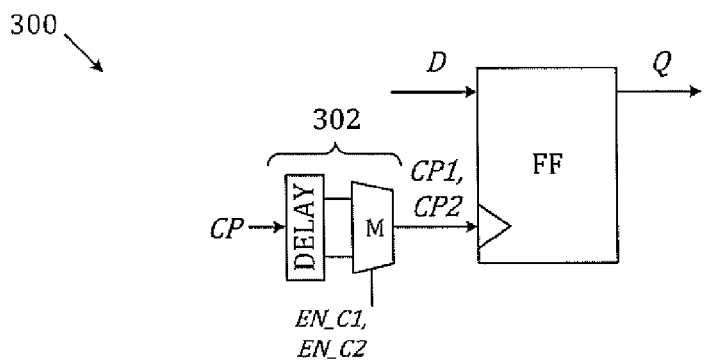
FIG. 3 is a schematic block diagram of a flip-flop cell having a selective delay in accordance with an embodiment of the present invention.
Figure 4:
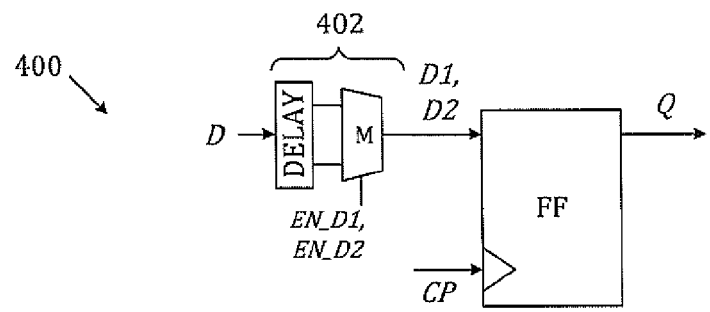
FIG. 4 is a schematic block diagram of a flip-flop cell having a selective delay in accordance with another embodiment of the present invention.

FIGS. 3 and 4 illustrate flip-flop cells 300 and 400 that enable time borrowing during the design of the IC to improve setup times while avoiding introducing meta-stability, and alternatively enable hold time violations to be avoided. The flip-flop cells 300 and 400 enable the timing to be adjusted during the design of the IC by modifying the metal layer connections during routing.

FIGS. 3 and 4 illustrate ICs in accordance with embodiments of the invention, which include flip-flop cells 300 and/or 400, and also include logic cells such as 102 and 104 (not shown in FIGS. 3 and 4). The flip-flop cells 300 and/or 400 are connected with the logic cells 102 and 104 to form functional data paths in a functional mode of operation, and are connected together to form scan data paths in a scan test mode of operation for shifting scan test data through the IC, as is known in the art.

A selective delay cell 302, 402 is provided for a flip-flop cell 300, 400 in a data path, the flip-flop cell 300, 400 having a clock signal CP1, CP2, CP controlling both the input and output of the flip-flop cell. The selective delay cell 302, 402 selectively delays one of a data signal D input to the flip-flop cell 300, 400 and the clock signal CP controlling the flip-flop cell 300, 400. The selectively delayed signal D1, D2; CP1, CP2 adjusts the timing of the data path. Specifically, the setup, hold and/or clock-to-output timing of the data path may be adjusted by the selectively delayed signal.

The selective delay cell 302, 402 may have first and second delay paths 504, 506; 604, 606 for introducing respective delays, and a multiplexer 508, 608 providing the selected delayed signal D1 or D2; CP1 or CP2 to the flip-flop cell in the data path. A control signal EN, ENb may control the multiplexer 508, 608 to select from the first and second delay paths 504, 506; 604, 606. The control signal may be provided by a tie cell (not shown). According to the value EN_C1 or EN_C2, or EN_D1 or EN_D2, of the control signal EN, the output of the multiplexer will adopt a corresponding value C1 or C2, or D1 or D2 for the delay, which may be faster or slower than the inputs to other flip-flops in the IC.

The selectively delayed signal CP1 or CP2 may reduce setup timing slack of the flip-flop cell 108 to which it is provided and reduce the propagation time of the data path. The selectively delayed signal D1 or D2 may avoid setup timing violation of the flip-flop cell 106, 108 to which it is provided.

The flip-flop cell 106 or 108 to which the selectively delayed signal is provided may have master and slave latches clocked by the same clock signal CP1 or CP2.

Figure 5:
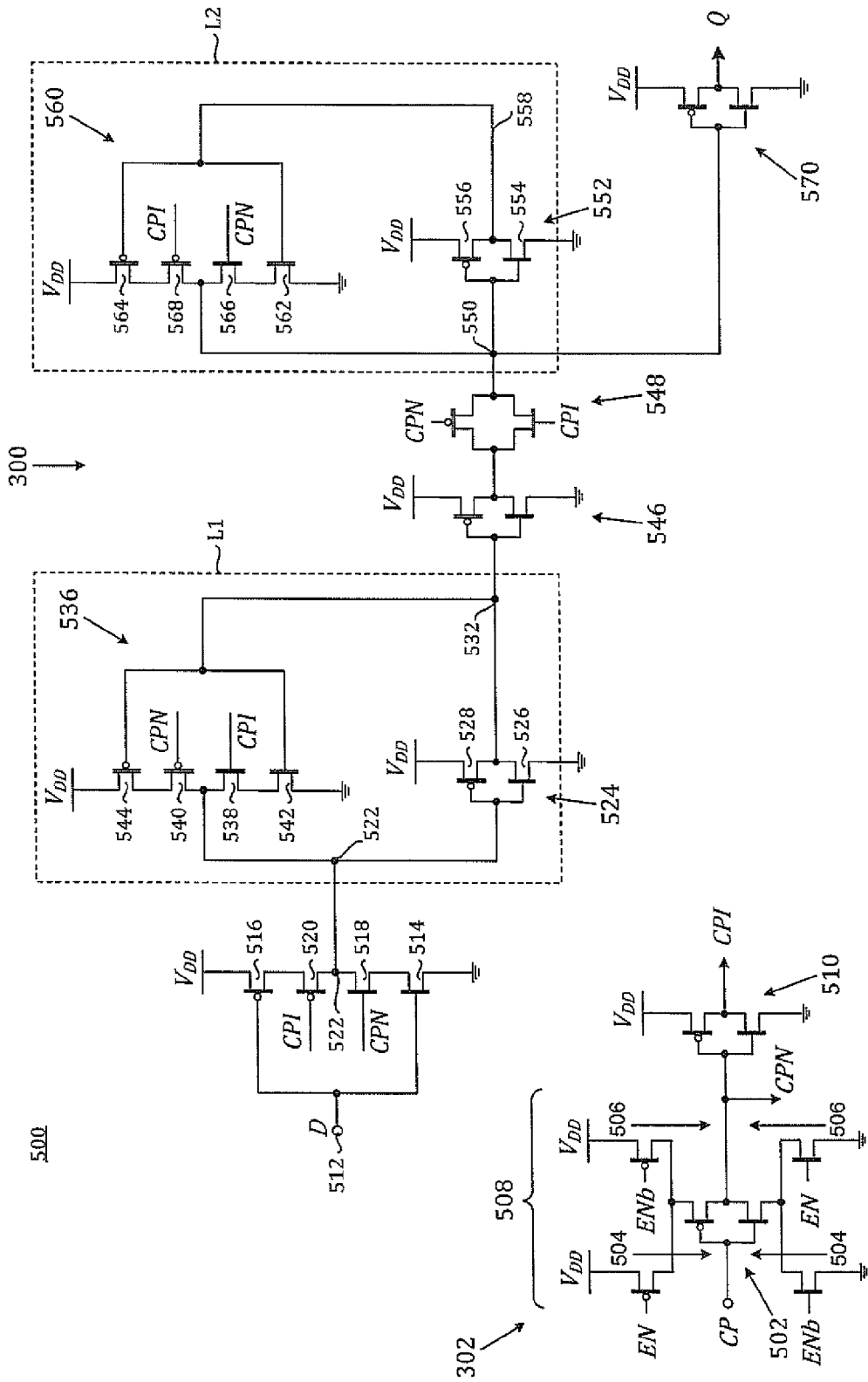
FIGS. 5 and 6 are circuit diagrams of the flip-flop cells of FIGS. 3 and 4 respectively.
Figure 6:
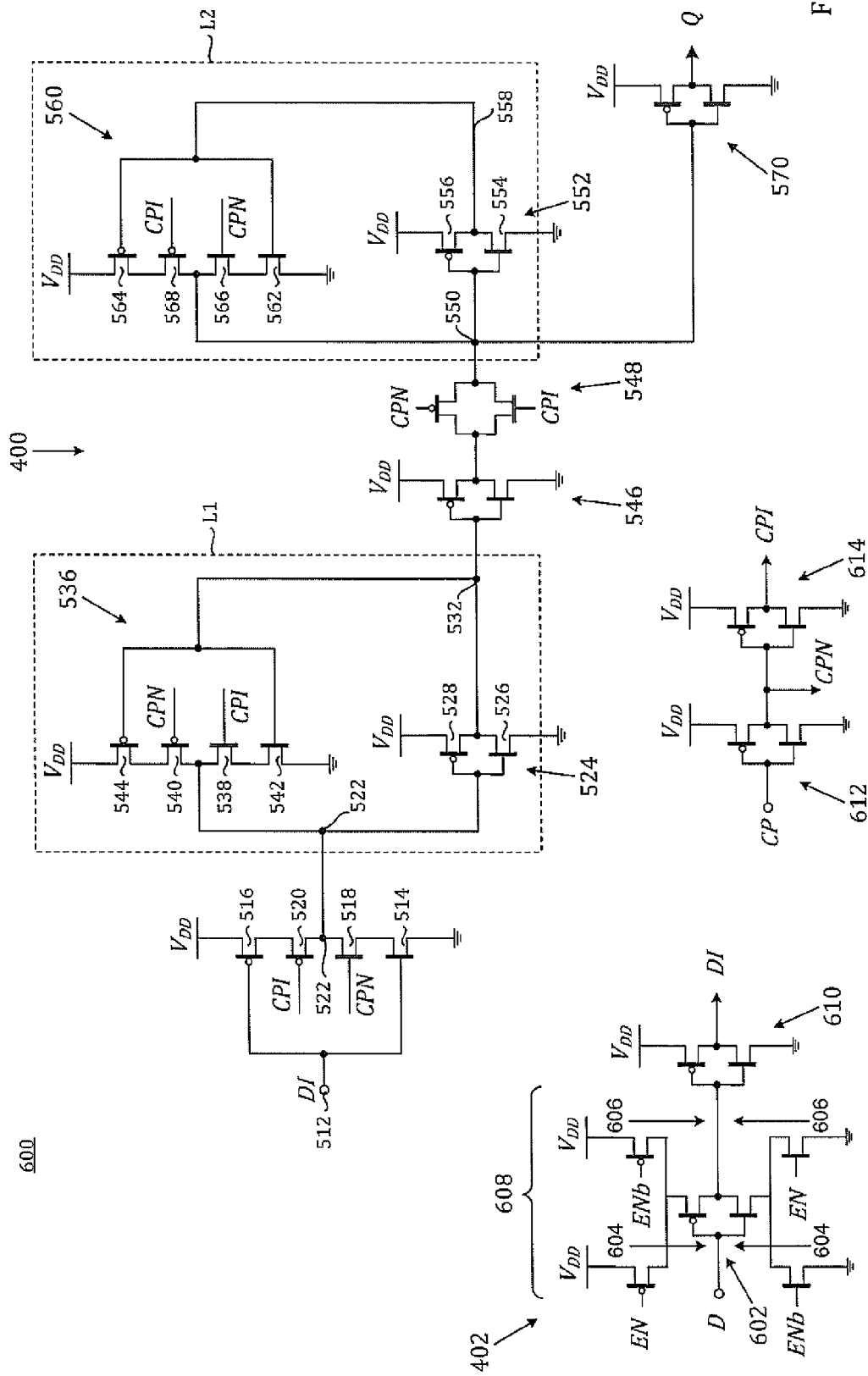

FIGS. 5 and 6 show in more detailed examples of circuits 500 and 600 including the flip-flop cells 300 and 400 and the selective delay cells 302 and 402, respectively, using complementary metal-oxide-semiconductor (CMOS) technology. Referring first to FIG. 5, the selective delay cell 302 has an inverter 502 having a complementary pair of CMOS transistors whose current conduction paths are connected in series with the parallel data paths 504 and 506. The input of the inverter 502 receives the common clock signal CP. The multiplexer 508 comprises two p-type transistors connected in series in the respective parallel data paths 504 and 506 between the voltage supply $V_{DD}$ and the inverter 502, and two n-type transistors connected in series in the respective parallel data paths 504 and 506 between the inverter 502 and ground. The output of the inverter 502 provides an inverted clock signal CP and is connected to an input of an inverter 510. The output of the inverter 510 provides a doubly inverted clock signal CPI.

The flip-flop cells 300 or 400 may be any suitable design. In this case, the flip-flop cell 300 has an input 512 that receives the input data signal D. A clock gating module has an inverter including complementary transistors 514 and 516 whose gates are connected to the input 512 to receive the data signal D. The current conduction paths of the transistors 514 and 516 are connected in series with the current conduction paths of complementary transistors 518 and 520 between the voltage supply $V_{DD}$ and ground, the gates of the transistors 518 and 520 receiving the clock signals CPN and CPI, respectively. The clock gating module has an output node 522, which is connected to the master latch L1 of the flip-flop cell 300, which in turn drives the slave latch L2.

In the flip-flop cell 300, the same complementary clock inputs are provided to both latches L1 and L2 of the flip-flop by the inverters 502 and 510. The input node 522 of the flip-flop is connected to a feed-forward inverter 524 of the master latch L1 formed by a complementary pair of CMOS transistors 526 and 528 whose gates are connected to the flip-flop input node 522 and having current conduction paths connected in series between the voltage supply $V_{DD}$ and ground. An output node 532 of the inverter 524, at the connection between the current conduction paths of the transistors 526 and 528, is connected to a clocked tri-state feedback inverter 536. The feedback inverter 536 includes a complementary pair of CMOS transistors 538 and 540 whose gates are connected to the node 532 and a complementary pair of CMOS transistors 542 and 544 whose gates receive the clock signals CPI and CPN. The current conduction paths of the transistors 542 and 544 connect the current conduction paths of the transistors 538 and 540 to ground and the voltage supply $V_{DD}$, respectively. The connection between the current conduction paths of the transistors 538 and 540 is connected to the input node 522 of the master latch L1.

The output node 532 of the master latch 524 is connected to an inverter 546 formed by a complementary pair of CMOS transistors whose current conduction paths are connected in series between the voltage supply $V_{DD}$ and ground. The output of the inverter 546 is connected to a clocked gate module 548 formed by a complementary pair of CMOS transistors whose current conduction paths are connected in parallel between the output of the inverter 546 and an output node 550 of the gate module 548. The gates of the transistors of the gate 550 are connected to receive the clock signals CPI and CPN so as to pass the output signal of the inverter 546 when the clock signal CPI is asserted.

The output node 550 of the gate module 548 is connected to the input of the slave latch L2. The slave latch L2 includes a feed-forward inverter 552 formed by a complementary pair of CMOS transistors 554 and 556 whose gates are connected to the node 550 and having current conduction paths connected in series between the voltage supply $V_{DD}$ and ground. A node 558 of the feed-forward inverter 552, at the connection between the current conduction paths of the transistors 554 and 556 is connected to a clocked tri-state feedback inverter 560. The feedback inverter 560 includes a complementary pair of CMOS transistors 562 and 564 whose gates are connected to the node 558 and a complementary pair of CMOS transistors 566 and 568 whose gates receive the clock signals CPN and CPI. The current conduction path of the transistor 566 connects the current conduction path of the transistor 562 to ground. The current conduction path of the transistor 568 connects the current conduction path of the transistor 564 to the voltage supply $V_{DD}$. The connection between the current conduction paths of the transistors 562 and 564 is connected to the input node 550 of the slave latch L2. An inverter 570 having a complementary pair of CMOS transistors 572 and 574 whose gates are connected to the node 550 provides the output Q of the flip-flop cell 300.

As shown in FIG. 6, the selective delay cell 402 has an inverter 602 having a complementary pair of CMOS transistors whose current conduction paths are connected in series with the parallel data paths 604 and 606. The input of the inverter 602 receives the common data signal D. The multiplexer 608 comprises two p-type transistors connected in series in the respective parallel data paths 604 and 606 between the voltage supply $V_{DD}$ and the inverter 602, and two n-type transistors connected in series in the respective parallel data paths 604 and 606 between the inverter 602 and ground. The output of the inverter 602 is connected to an input of an inverter 610. The output of the inverter 610 provides a doubly inverted data signal DI. The clock signals CPN and CPI are provided, respectively, by the outputs of serially connected inverters 612 and 614, the input of the inverter 612 receiving the common clock signal CP.

The flip-flop cell 400 may be of any suitable design. As shown, the flip-flop cell 400 is similar to the flip-flop cell 300, except that the input 512 receives the doubly inverted input data signal DI.

The two (or more) delay paths 504, 506; 604, 606 have different signal delays. The different delays are obtained by adopting different parameters for the different transistors of the multiplexers specific to the different delay paths 504, 506; 604, 606. Parameters which can be differentiated include, for example the widths and lengths of the transistors, the threshold voltage of the transistors, and the stacking and architecture of the transistors. The control signals EN and ENb can be defined by tie cells that apply a selected constant voltage different from the voltage supply $V_{DD}$ and ground, for example.

Figure 7:
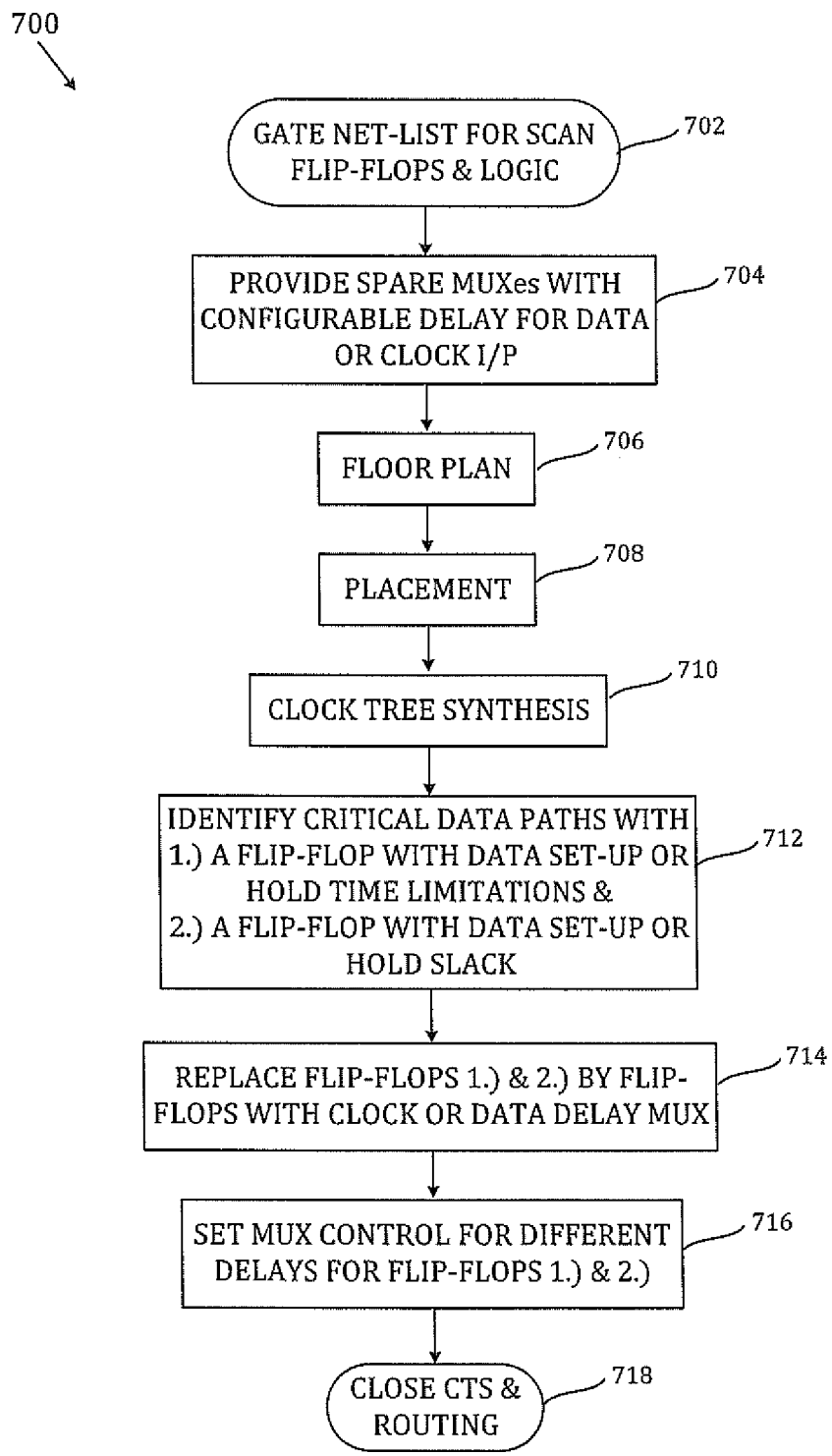
FIG. 7 is a flow chart of a method of adjusting timing in an integrated circuit (IC) design in accordance with an embodiment of the invention.
Figure 8:
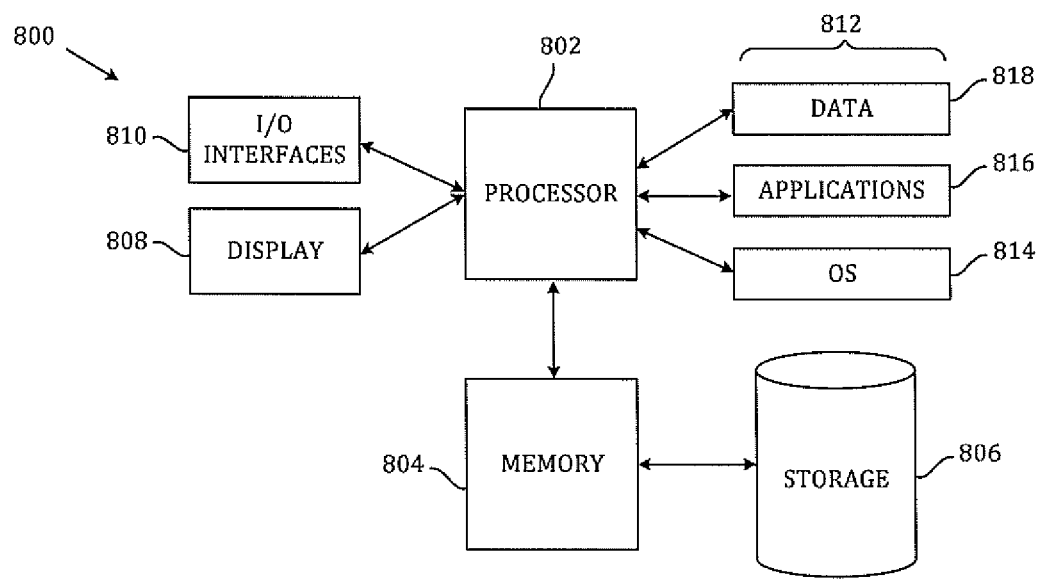
FIG. 8 is a schematic block diagram of an EDA tool in accordance with an embodiment of the present invention for performing the method of FIG. 7.

FIG. 7 illustrates a method 700, in accordance with an embodiment of the invention, of adjusting timing in design of such an integrated circuit (IC) using an electronic design automation (EDA) tool such as EDA tool 800 shown in FIG. 8. The method 700 may comprise at 702 providing a gate net-list for the flip-flop cells 106, 108 and logic cells 102, 104. Spare selective delay cells 302, 402, or spare flip-flop cells 300, 400 with selective delay cells 302, 402, may be provided in the net-list at 704. A floor plan may be derived at 706 and placement performed at 708. The clock tree synthesis (CTS) may be performed at 710.

At 712, critical timing is identified in a data path including a flip-flop cell that has a clock signal controlling both its input and output. The critical timing may be a flip-flop, like 108 that has setup time limitations but hold time slack, or may be a flip-flop that has hold time violation but setup time slack. At 714, a selective delay cell 302 or 402 is provided for the flip-flop cell in the data path. At 716, the selective delay cell selectively delays one of a data signal input D to the flip-flop cell and the clock signal CP controlling the flip-flop cell, which may be achieved by setting a control signal provided by a tie cell for a multiplexer selecting one of first and second delay paths introducing respective delays. The selectively delayed signal D1, D2 or CP1, CP2 adjusts the timing of the data path. The setup, hold and/or clock-to-output timing of the data path may be adjusted by the selectively delayed signal.

At 714, providing the selective delay cell 302 or 402 for the flip-flop cell may comprise replacing the flip-flop cell in the data path by a replacement flip-flop cell 300 or 400 including the selective delay cell 302 or 402.

At 718 the design method may proceed to CTS closure, routing and subsequent steps.

The method 700 is performed using an electronic design automation (EDA) tool such as the EDA tool 800 shown in FIG. 8, wherein the EDA tool 800 includes a processor 802 and a memory 804, 806 coupled to the processor 802, and wherein the IC design is stored in the memory 804, 806. Instructions corresponding to the steps of the method 700 may be stored in a non-transitory computer-readable storage medium and, when executed by the EDA tool 800 cause the EDA tool to perform the method 700.

The EDA tool 800 also includes a display device 808, input/output interfaces 810, and software 812. The software 812 includes operating system software 814, applications programs 816, and data 818. The EDA tool 800 generally is known in the art except for the software used to implement the method described above regarding estimating maximum capacitive cell load in an integrated circuit design. When software or a program is executing on the processor 802, the processor becomes a "means-for" performing the steps or instructions of the software or application code running on the processor 802. That is, for different instructions and different data associated with the instructions, the internal circuitry of the processor 802 takes on different states due to different register values, and so on, as is known by those of skill in the art. Thus, any means-for structures described herein relate to the processor 802 as it performs the steps of the methods disclosed herein.

The invention may be implemented at least partially in a non-transitory machine-readable medium containing a computer program for running on a computer system, the program at least including code portions for performing steps of a method according to the invention when run on a programmable apparatus, such as a computer system.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on non-transitory computer-readable media permanently, removably or remotely coupled to an information processing system. The computer-readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM and so on; and data transmission media including computer networks, point-to-point telecommunication equipment, and carrier wave transmission media, just to name a few.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above described operations are merely illustrative. Multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit (IC), comprising:
a plurality of flip-flop cells, wherein ones of the flip-flop cells are connected with other ones of the flip-flop cells to form functional data paths in a functional mode of operation, and are connected together in series to form scan data paths in a scan test mode of operation for shifting scan test data through the IC; and
a selective delay cell connected to a selected one of the flip-flop cells, the selected flip-flop cell having a clock signal controlling both the input and output thereof, wherein the selective delay cell modifies a delay of one of a data signal input to the selected flip-flop cell and the clock signal controlling the selected flip-flop cell,
wherein the selected delayed signal adjusts the timing of the functional data path in which the selected one of the flip-flop cells is located, and
wherein the selective delay cell has first and second delay paths for introducing respective first and second delays to the selected delayed signal, and a multiplexer having inputs connected to the first and second delay paths and an output that provides the selected delayed signal, wherein the output of the multiplexer is connected to the selected flip-flop cell for providing the selected delayed signal thereto.

2. The IC of claim 1, wherein a control signal controls the multiplexer to select from the first and second delay paths.

3. The IC of claim 1, wherein the selected delayed signal reduces setup timing slack of the selected flip-flop cell, thereby reducing a propagation time of the functional data path in which the selected one of the flip-flop cells is located.

4. The IC of claim 1, wherein the selected delayed signal avoids a setup timing violation of the selected flip-flop cell.

5. The IC of claim 1, wherein the selected flip-flop cell has master and slave latches clocked by the same clock signal.

6. A method of adjusting timing in an integrated circuit (IC) design, the design including a plurality of flip-flop cells, using an electronic design automation (EDA) tool, wherein ones of the flip-flop cells are connected with the other ones of the flip-flop cells to form functional data paths in a functional mode of operation, and are connected together in series to form scan data paths in a scan test mode of operation for shifting scan test data through the IC, the method comprising:
identifying critical timing in a data path including a first flip-flop cell that has a clock signal controlling both an input and an output of the first flip-flop cell, using the EDA tool; and
connecting a selective delay cell to the first flip-flop cell, using the EDA tool, wherein the selective delay cell selectively delays one of a data signal input to the first flip-flop cell and the clock signal controlling the first flip-flop cell,
wherein the selectively delayed signal adjusts the timing of the functional data path in which the first the flip-flop cells is located, and
wherein the selective delay cell has first and second delay paths for introducing respective first and second delays to the selected delayed signal, and a multiplexer having inputs connected to the first and second delay paths and an output for providing the selected delayed signal, wherein the output of the multiplexer is connected to the first flip-flop cell for providing the selected delayed signal thereto.

7. The method of claim 6, wherein connecting the selective delay cell comprises replacing the first flip-flop cell with a replacement flip-flop cell including the selective delay cell.

8. The method of claim 7, wherein the selectively delayed signal reduces setup timing slack of the first flip-flop cell, thereby reducing a propagation time of the data path within which the first flip-flop cell is located.

9. The method of claim 7, wherein the selectively delayed signal avoids a setup timing violation of the first flip-flop cell.

10. The method of claim 7, wherein the first flip-flop cell has master and slave latches clocked by the same clock signal.

11. The method of claim 6, wherein a control signal controls the multiplexer to select from the first and second delay paths.

* * * * *